(12) United States Patent
Xu et al.

(10) Patent No.: US 10,937,350 B2
(45) Date of Patent: Mar. 2, 2021

(54) VOLTAGE CONTROL CIRCUIT AND METHOD OF CONTROL THE SAME, DISPLAY DEVICE

(71) Applicants: FUZHOU BOE OPTOELECTRONICS TECHNOLOGY CO., LTD., Fujian (CN); BOE TECHNOLOGY GROUP CO., LTD., Beijing (CN)

(72) Inventors: Weize Xu, Beijing (CN); Yichiang Lai, Beijing (CN); Zuwei Weng, Beijing (CN); Bin Weng, Beijing (CN); Jiujian Han, Beijing (CN); Qianglong Li, Beijing (CN); Nani Liu, Beijing (CN); Yupeng Huang, Beijing (CN)

(73) Assignees: FUZHOU BOE OPTOELECTRONICS TECHNOLOGY CO., LTD., Fujian (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/712,549

(22) Filed: Dec. 12, 2019

(65) Prior Publication Data

US 2020/0265765 A1 Aug. 20, 2020

(30) Foreign Application Priority Data

Feb. 15, 2019 (CN) .......................... 201910117899.8

(51) Int. Cl.
*G09G 3/20* (2006.01)
*H03K 17/567* (2006.01)

(52) U.S. Cl.
CPC ............. *G09G 3/20* (2013.01); *H03K 17/567* (2013.01); *G09G 2310/0291* (2013.01); *G09G 2310/08* (2013.01); *G09G 2330/028* (2013.01)

(58) Field of Classification Search
CPC ............. G09G 3/20; G09G 2310/0291; G09G 2310/08; G09G 2330/028; H03K 17/567
(Continued)

(56) References Cited

U.S. PATENT DOCUMENTS

| 5,434,599 | A | * | 7/1995 | Hirai | ..................... | G09G 3/3622 |
| | | | | | | 345/100 |
| 7,714,620 | B1 | * | 5/2010 | Xu | ........................ | H03K 5/2481 |
| | | | | | | 327/63 |

(Continued)

*Primary Examiner* — Chanh D Nguyen
*Assistant Examiner* — Ngan T. Pham-Lu
(74) *Attorney, Agent, or Firm* — Brooks Kushman P.C.

(57) ABSTRACT

A voltage control circuit and a method of controlling the same, and a display device are provided. The comparison sub-circuit is coupled to a first reference voltage end, a second reference voltage end, a feedback voltage end and a comparison output end which is coupled to the switching sub-circuit. The switching sub-circuit is further coupled to an output voltage end, an initial voltage end and a replacement voltage end. The comparison sub-circuit determines whether a voltage of the feedback voltage end is between the first reference voltage and the second reference voltage. The switching sub-circuit transmits a voltage of the initial voltage end to the output voltage end in response to a first control signal of the comparison output end; transmit a voltage of the replacement voltage end to the output voltage end in response to a second control signal of the comparison output end.

14 Claims, 5 Drawing Sheets

(58) Field of Classification Search
USPC .......................................................... 345/212
See application file for complete search history.

(56) References Cited

U.S. PATENT DOCUMENTS

2009/0244421 A1* 10/2009 Ishii .................. G02F 1/136204
 349/40
2015/0236687 A1* 8/2015 Shimada ........... H01L 29/78648
 315/297

* cited by examiner

VOLTAGE CONTROL CIRCUIT AND METHOD OF CONTROL THE SAME, DISPLAY DEVICE

CROSS REFERENCE OF RELATED APPLICATION

This application claims priority to Chinese Patent Application No. 201910117899.8 filed on Feb. 15, 2019, which is incorporated herein by reference in its entirety.

TECHNICAL FIELD

The present disclosure relates to field of display technology, and in particular to a voltage control circuit and a method of controlling the same, and a display device.

BACKGROUND

In the production of the display panel, in order to avoid the common voltage signal from fading at the far-end and the middle and resulting in checkerboard afterimages, the common voltage fed back from the far-end is generally compensated and amplified and then input to the far-end and the middle of the display panel.

However, during the display process of the display panel, the gate drive signal (especially during the high-low level switching process) output by the gate drive circuit (generally a GOA circuit) will be coupled with the common voltage signal and resulting in a ripple of the common voltage signal. As a result, after the fed back common voltage is compensated and amplified and then input to the display panel, and the ripple amplitude of the common voltage signal further increases (especially for far-end common voltage), and eventually horizontal white lines appear on the display.

SUMMARY

A voltage control circuit is provided in the present disclosure, including a comparison sub-circuit and a switching sub-circuit;

the comparison sub-circuit is coupled to a first reference voltage end, a second reference voltage end, a feedback voltage end and a comparison output end, the comparison output end is coupled to the switching sub-circuit, where the second reference voltage end is configured to input a second reference voltage, and first reference voltage end is configured to input a first reference voltage smaller than the second reference voltage;

the switching sub-circuit is further coupled to an output voltage end, an initial voltage end and a replacement voltage end, where the replacement voltage end is configured to input a voltage between the first reference voltage and the second reference voltage;

the comparison sub-circuit is configured to:

determine whether a voltage of the feedback voltage end is between the first reference voltage of the first reference voltage end and the second reference voltage of the second reference voltage end;

in the case that the voltage of the feedback voltage end is between the first reference voltage of the first reference voltage end and the second reference voltage of the second reference voltage end, control the comparison output end to output a first control signal;

in the case that the voltage of the feedback voltage end is not between the first reference voltage of the first reference voltage end and the second reference voltage of the second reference voltage end, control the comparison output end to output a second control signal;

the switching sub-circuit is configured to:

in the case that the voltage of the feedback voltage end is between the first reference voltage of the first reference voltage end and the second reference voltage of the second reference voltage end, transmit a voltage of the initial voltage end to the output voltage end, in response to the first control signal of the comparison output end; or in the case that the voltage of the feedback voltage end is not between the first reference voltage of the first reference voltage end and the second reference voltage of the second reference voltage end, transmit a voltage of the replacement voltage end to the output voltage end, in response to the second control signal of the comparison output end.

Optionally, the replacement voltage end is configured to input an intermediate voltage of the first reference voltage and the second reference voltage.

Optionally, the comparison sub-circuit is a dual-limit comparator;

the first reference voltage end is configured to input a lower threshold voltage of the dual-limit comparator, and the second reference voltage end is configured to input an upper threshold voltage of the dual-limit comparator, where the first voltage is equal to the lower threshold voltage of the dual-limit comparator, the second voltage is equal to the upper threshold voltage of the dual-limit comparator;

the feedback voltage end is configured to input an input voltage of the dual-limit comparator; and the comparison output end is an output end of the dual-limit comparator.

Optionally, the switching sub-circuit includes a first transistor, a second transistor, a third transistor, a first resistor, a second resistor and a third resistor;

a gate of the first transistor is coupled to the comparison output end via the first resistor, a first electrode of the first transistor is coupled to the initial voltage end, and a second electrode of the first transistor is coupled to the output voltage end;

a gate of the second transistor is coupled to the comparison output end, a first electrode of the second transistor is coupled to a first voltage end via the second resistor, and a second electrode of the second transistor is coupled to a second voltage end;

a gate of the third transistor is coupled to the first electrode of the second transistor via a third resistor, a first electrode of the third transistor is coupled to the replacement voltage end, and a second electrode of the third transistor is coupled to the output voltage end.

Optionally, the first transistor, the second transistor and the third transistor are all N-type transistors.

Optionally, the dual-limit comparator includes a first operational amplifier and a second operational amplifier;

an inverting input end of the first operational amplifier is coupled to the first reference voltage end, and a non-inverting of the first operational amplifier and an inverting input end of the second operational amplifier are coupled to the feedback voltage end;

a non-inverting of the second operational amplifier is coupled to the second reference voltage end;

an output end of the first operational amplifier is coupled to an output end of the second operational amplifier, and the output end of the first operational amplifier and the output end of the second operational amplifier serve as the output end of the dual-limit comparator.

A display device is further provided in the present disclosure, including a display panel and a far-end common voltage control circuit;

the far-end common voltage control circuit is the voltage control circuit hereinabove;

the display panel includes a common electrode and a common voltage input region, the common electrode includes a near-end region and a far-end region further from the common voltage input region than the near-end region;

the common voltage input region includes: a near-end common voltage input end coupled to the near-end region of the common electrode and a far-end common voltage input end coupled to the far-end region of the common electrode;

in the far-end common voltage control circuit, the feedback voltage end is coupled to the far-end region of the common electrode, the output voltage end is coupled to the far-end common voltage input end, and the initial voltage end is coupled to a far-end common voltage supply end.

Optionally, in the far-end common voltage control circuit, the replacement voltage end is coupled to a near-end common voltage supply end.

Optionally, the common electrode further includes: a middle region between the near-end region and the far-end region; and the common voltage input region further includes: a middle common voltage input end coupled to the middle region of the common electrode;

the display device further includes: a middle common voltage control circuit;

the middle common voltage control circuit and the far-end common voltage control circuit have the same circuit structure;

in the middle common voltage control circuit, the feedback voltage end is coupled to the middle region or the far-end region of the common electrode, the output voltage end is coupled to the middle common voltage input end, and the initial voltage end is coupled to a middle common voltage supply end.

Optionally, in the middle common voltage control circuit, the replacement voltage end is coupled to a near-end common voltage supply end.

Optionally, the voltage control circuit is integrated in a timing sequence control circuit.

A method of controlling the voltage control circuit hereinabove is further provided in the present disclosure, including:

inputting a first reference voltage to the first reference voltage end, inputting a second reference voltage to the second reference voltage end, and inputting a feedback voltage to the feedback voltage end;

in the case that the feedback voltage is between the first reference voltage and the second reference voltage, transmitting, by the switching sub-circuit, a voltage of the initial voltage end to the output voltage end;

in the case that the feedback voltage is not between the first reference voltage and the second reference voltage, transmitting, by the switching sub-circuit, a voltage of the replacement voltage end to the output voltage end.

Optionally, a voltage of the replacement voltage end is an intermediate voltage of the first reference voltage and the second reference voltage.

Optionally, the comparison sub-circuit is a dual-limit comparator;

the first reference voltage of the first reference voltage end is a lower threshold voltage of the dual-limit comparator, and the second reference voltage of the second reference voltage end is an upper threshold voltage of the dual-limit comparator;

a voltage of the feedback voltage end is an input voltage of the dual-limit comparator; and the comparison output end is an output end of the dual-limit comparator.

BRIEF DESCRIPTION OF THE DRAWINGS

In order to more clearly explain the embodiments of the present disclosure or the technical solutions in the prior art, the drawings used in the description of the embodiments or the prior art will be briefly introduced below. Obviously, the drawings in the following description are merely some embodiments of the present disclosure. For those of ordinary skill in the art, other drawings may be obtained based on these drawings without creative work.

DETAILED DESCRIPTION

In the following, the technical solutions in the embodiments of the present disclosure will be clearly and completely described with reference to the drawings in the embodiments of the present disclosure. Obviously, the described embodiments are only a part of the embodiments of the present disclosure, but not all of the embodiments. Based on the embodiments of the present disclosure, all other embodiments obtained by a person of ordinary skill in the art without creative efforts shall fall within the scope of the present disclosure.

Unless otherwise defined, the technical terms or scientific terms used in the embodiments of the present disclosure shall have the ordinary meanings understood by those with ordinary skills in the field to which the present disclosure belongs. The terms "first", "second" and the like used in the embodiments of the present disclosure do not indicate any order, quantity, or importance, but are only used to distinguish different components. Words such as "includes" or "including" mean that the element or item appearing before the word encompasses the element or item appearing after the word and its equivalent without excluding other elements or items. Words such as "connected" or "connect" are not limited to physical or mechanical connections, but may include electrical connections, whether direct or indirect. "up", "down", "left", "right", etc. are only used to indicate the relative position relationship. When the absolute position of the described object changes, the relative position relationship may also change accordingly.

Figure 1:
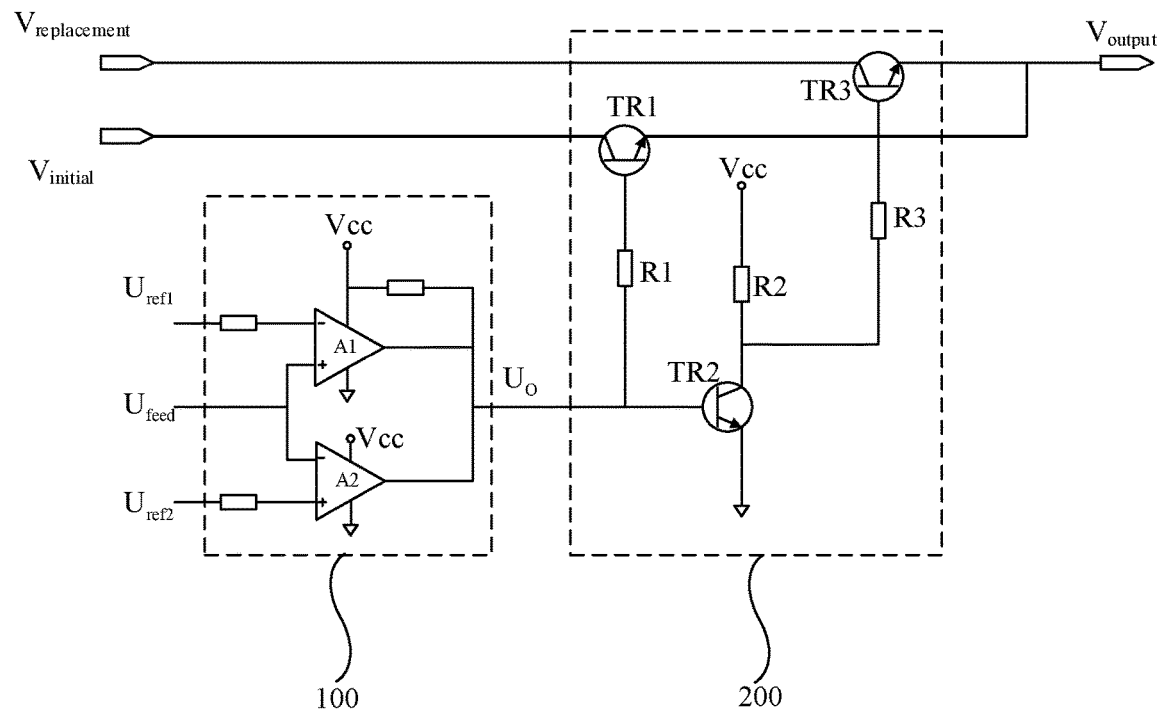
FIG. 1 is a schematic view of a voltage control circuit in some embodiments of the present disclosure.

A voltage control circuit is provided in some embodiments of the present disclosure. As shown in FIG. 1, the voltage control circuit 01 includes a comparison sub-circuit 100 and a switching sub-circuit 200.

Referring to FIG. 1, the comparison sub-circuit 100 is coupled to a first reference voltage end $U_{ref1}$, a second reference voltage end $U_{ref2}$, a feedback voltage end $U_{feed}$ and a comparison output end $U_O$. The second reference voltage $V_{ref2}$ of the second reference voltage end $U_{ref2}$ is greater than the first reference voltage $V_{ref1}$ of the first reference voltage end $U_{ref1}$.

In addition, the comparison output end $U_O$ of the comparison sub-circuit 100 is coupled to the switching sub-circuit 200, the switching sub-circuit 200 is further coupled to the output voltage end $V_{output}$, the initial voltage end $V_{initial}$ (that is, the initial power supply end) and the replacement voltage end $V_{replacement}$. The voltage of the replacement voltage end $V_{replacement}$ is between the first reference voltage $V_{ref1}$ and the second reference voltage $V_{ref2}$.

Of course, in practice, the voltage of the replacement voltage end $V_{replacement}$ may be an intermediate voltage of the first reference voltage $V_{ref1}$ and the second reference voltage $V_{ref2}$.

Based on the above, in the voltage control circuit 01:

The comparison sub-circuit 100 is configured to:

determine whether the voltage of the feedback voltage end $U_{feed}$ is between the first reference voltage $V_{ref1}$ of the first reference voltage end $U_{ref1}$ and the second reference voltage $V_{ref2}$ of the second reference voltage end $U_{ref2}$;

in the case that the voltage of the feedback voltage end $U_{feed}$ is between the first reference voltage $V_{ref1}$ of the first reference voltage end $U_{ref1}$ and the second reference voltage $V_{ref2}$ of the second reference voltage end $U_{ref2}$, control the comparison output end $U_O$ to output a first control signal; and in the case that the voltage of the feedback voltage end $U_{feed}$ is not between the first reference voltage $V_{ref1}$ of the first reference voltage end $U_{ref1}$ and the second reference voltage $V_{ref2}$ of the second reference voltage end $U_{ref2}$, control the control comparison output end $U_O$ to output a second control signal.

The switching sub-circuit 200 is configured to transmit the voltage of the initial voltage end $V_{initial}$ to the output voltage end $V_{output}$ in response to the first control signal of the comparison output end $U_O$. The switching sub-circuit 200 is further configured to transmit the voltage of the replacement voltage end $V_{replacement}$ to the output voltage end $V_{output}$ in response to the second control signal of the comparison output end $U_O$.

It should be noted that, those skilled in the art may understand that, firstly, the voltage control circuit in the present disclosure outputs a voltage to an electronic component or device through the output voltage end $V_{output}$, so as to ensure the normal operation of the electronic component or device. Due to the attenuation of the signal during the signal transmission and the loss caused by the resistance of the electronic component or device, etc., the actual measured voltage on the electronic component or device is not completely the same as the output voltage at the output voltage end $V_{output}$. Based on this, in practice, the actual voltage actually detected in the electronic component or device is generally transmitted as the feedback voltage to the feedback voltage end $U_{feed}$.

Secondly, for the actual setting of the first reference voltage and the second reference voltage, the range of the first reference voltage and the second reference voltage may be set manually based on the actual operating voltage of the electronic component or device and the transmission loss, as long as the electronic components or devices may be within the normal operating voltage range.

In summary, according to the voltage control circuit in the present disclosure, the comparing sub-circuit may determine whether the voltage of the feedback voltage end is between the first reference voltage and the second reference voltage, and then the switching sub-circuit may adjust the output voltage of the output voltage end. In the case that the voltage of the feedback voltage end is between the first reference voltage and the second reference voltage, the output voltage end is controlled to maintain the initial voltage of the initial voltage end for output. In the case that the voltage of the feedback voltage end is not between the first reference voltage and the second reference voltage, the output voltage end is controlled to output the voltage of the replacement voltage end. In this way, it is able to avoid the voltage input to the electronic component or device from exceeding the operating voltage range thereof, thereby ensuring that the electronic component or device may work normally in the required operation voltage range.

Based on this, the specific circuit structures of the above-mentioned comparison sub-circuit 100 and switching sub-circuit 200 will be further described below.

In some embodiments, as shown in FIG. 1, the comparison sub-circuit 100 is a dual-limit comparator (also referred to as a dual-limit voltage comparator, a window comparator, etc.).

The first reference voltage $V_{ref1}$ of the first reference voltage end $U_{ref1}$ is used as the lower threshold voltage of the dual-limit comparator, and the second reference voltage $V_{ref2}$ of the second reference voltage end $U_{ref2}$ is used as the upper threshold voltage of the dual-limit comparator; The feedback voltage of the feedback voltage end $U_{feed}$ is used as the input voltage of the dual-limit comparator (that is, the voltage to be compared). The output of the dual-limit comparator is the comparison output $U_O$ of the comparison sub-circuit 100.

A specific dual-limit comparator circuit structure is described below, but the present disclosure is not limited thereto. In practice, the circuit structure of the dual-limit comparator may be appropriately adjusted.

As shown in FIG. 1, the dual-limit comparator includes a first operational amplifier A1 and a second operational amplifier A2. An inverting input end of the first operational amplifier A1 (i.e., a lower threshold voltage input end of the dual-limit comparator) is coupled to the first reference voltage end $U_{ref1}$, and a non-inverting of the first operational amplifier A1 and an inverting input end of the second operational amplifier A2 are coupled to the feedback voltage end $U_{feed}$. A non-inverting of the second operational amplifier A2 (i.e., an upper threshold voltage input end of the dual-limit comparator) is coupled to the second reference voltage end $U_{ref2}$. An output end of the first operational amplifier A1 is coupled to an output end of the second operational amplifier A2, and the output end of the first operational amplifier A1 and the output end of the second operational amplifier A2 serve as the output end of the dual-limit comparator (i.e., the comparison output $U_O$ of the comparison sub-circuit 100).

Optionally, as shown in FIG. 1, the above-mentioned switching sub-circuit 200 may include a first transistor TR1, a second transistor TR2 a third transistor TR3, a first resistor R1, a second resistor R2 and a third resistor R3.

A gate of the first transistor TR1 is coupled to the comparison output end $U_O$ via the first resistor R1, the first electrode of the first transistor TR1 is coupled to the initial voltage end $V_{initial}$, and the second electrode of the first transistor TR1 is coupled to the output voltage end $V_{output}$.

A gate of the second transistor TR2 is coupled to the comparison output end $U_O$, the first electrode of the second transistor TR2 is coupled to the first voltage end via the second resistor R2, and the second electrode of the second transistor TR2 is coupled to the second voltage end. Generally, the first voltage end is a high-level voltage end, such as a power supply voltage end Vcc, the second voltage end is a low-level voltage end, such as a ground end.

A gate of the third transistor TR3 is coupled to the first electrode of the second transistor TR2 (that is, the electrode coupled to the second resistor R2) via a third resistor R3. The first electrode of the third transistor TR3 is coupled to the replacement voltage end $V_{replacement}$. The second electrode of the third transistor TR3 is coupled to the output voltage end $V_{output}$.

It should be noted that, first, the transistors (TR1, TR2, TR3) may be N-type transistors or P-type transistors. In the present disclosure, N-type transistors may be used. If a P-type transistor is used, it is only necessary to adjust the first-off device. The transistor may be a transistor, a MOS transistor, an enhancement transistor, a depletion transistor, or the like. The first electrode of the transistor may be a source, the second electrode is a drain, or the first electrode of the transistor may be a drain, and the second electrode is a source, which are not limited in the present disclosure.

Secondly, the comparison sub-circuit 100 in the present disclosure is not limited to the dual-limit comparator described above, and may also be other comparison circuits. The switching sub-circuit 200 may also be other two-channel gating switch circuit, which is not limited herein.

A method of controlling the voltage control circuit hereinabove is further provided is some embodiments of the present disclosure.

Schematically, referring to FIG. 1, the method includes: inputting a first reference voltage $V_{ref1}$ to the first reference voltage end $U_{ref1}$, inputting a second reference voltage $V_{ref2}$ to the second reference voltage end $U_{ref2}$, and inputting a feedback voltage to the feedback voltage end $U_{feed}$;

in the case that the feedback voltage is between the first reference voltage $V_{ref1}$ and the second reference voltage $V_{ref2}$, transmitting, by the switching sub-circuit 200, a voltage of the initial voltage end $V_{initial}$ to the output voltage end $V_{output}$;

in the case that the feedback voltage is not between the first reference voltage $V_{ref1}$ and the second reference voltage $V_{ref2}$, transmitting, by the switching sub-circuit 200, a voltage of the replacement voltage end $V_{replacement}$ to the output voltage end $V_{output}$.

Illustratively, the specific control method shown in FIG. 1 is taken as an example to further describe the above method, specifically:

the first threshold voltage $V_{ref1}$ of the first reference voltage end $U_{ref1}$ is input to the lower threshold potential input end of the dual-limit comparator (comparison sub-circuit 100), and the second reference voltage $V_{ref2}$ of the second reference voltage end $U_{ref2}$ is input to the upper threshold potential input end, and the input end inputs the feedback voltage of the feedback voltage end $U_{feed}$.

Figure 2:
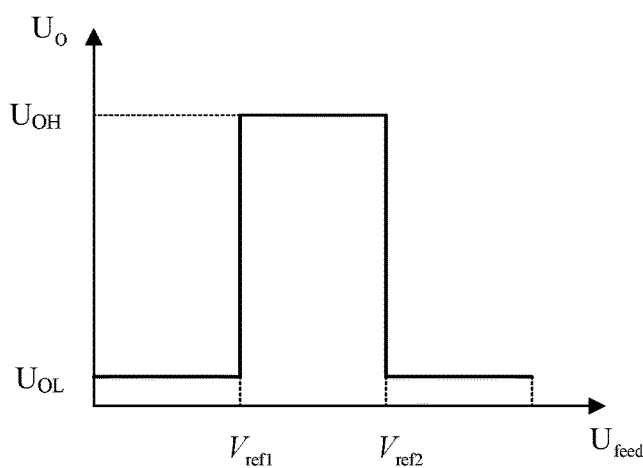
FIG. 2 is a schematic view of output voltage transmission characteristics of a dual-limit comparator in some embodiments of the present disclosure.

Referring to FIG. 2, in the case that the feedback voltage of the feedback voltage end $U_{feed}$ (also shown below as $U_{feed}$) is between the first reference voltage $V_{ref1}$ and the second reference voltage $V_{ref2}$ (i.e., the upper threshold level and the lower threshold level) ($V_{ref1} < U_{feed} < V_{ref2}$; that is, the electronic device or component is in the normal working voltage range), the output end (i.e., $U_O$) of the dual-limit comparator outputs a high-level $U_{OH}$ (i.e., the first control signal). Under a control of the high-level $U_{OH}$, the first transistor TR1 and the second transistor TR2 are turned on, and the third transistor TR3 is turned off. The switching sub-circuit 200 outputs the initial voltage of the initial voltage end $V_{initial}$ to the output voltage end $V_{output}$.

Referring to FIG. 2, in the case that the feedback voltage of the feedback voltage end $U_{feed}$ is outside the range between the first reference voltage $V_{ref1}$ and the second reference voltage $V_{ref2}$ ($U_{feed} < V_{ref1}$ or $U_{feed} > V_{ref2}$, that is, the electronic device or component is in an abnormal working voltage range). At this time, the output end (i.e., $U_O$) of the dual-limit comparator outputs a low-level $U_{OL}$ (i.e., the second control signal). Under the control of the low-level $U_{OL}$, the first transistor TR1 and the second transistor TR2 are turned off, and the third transistor TR3 is turned on, and the switching sub-circuit 200 outputs the voltage of the replacement voltage end $V_{replacement}$ to the output voltage end $V_{output}$.

It can be understood that the voltage of the replacement voltage end $V_{replacement}$ is between the first reference voltage $V_{ref1}$ and the second reference voltage $V_{ref2}$, so that the voltage of the output voltage end $V_{output}$ may ensure the normal operation of the electronic device or component.

It should be noted that the voltage control circuit 01 in the present disclosure may be applied to any electronic control field, which is not limited in the present disclosure. For example, the voltage control circuit 01 may be applied to a display device to avoid defects that occur during operation.

Figure 3:
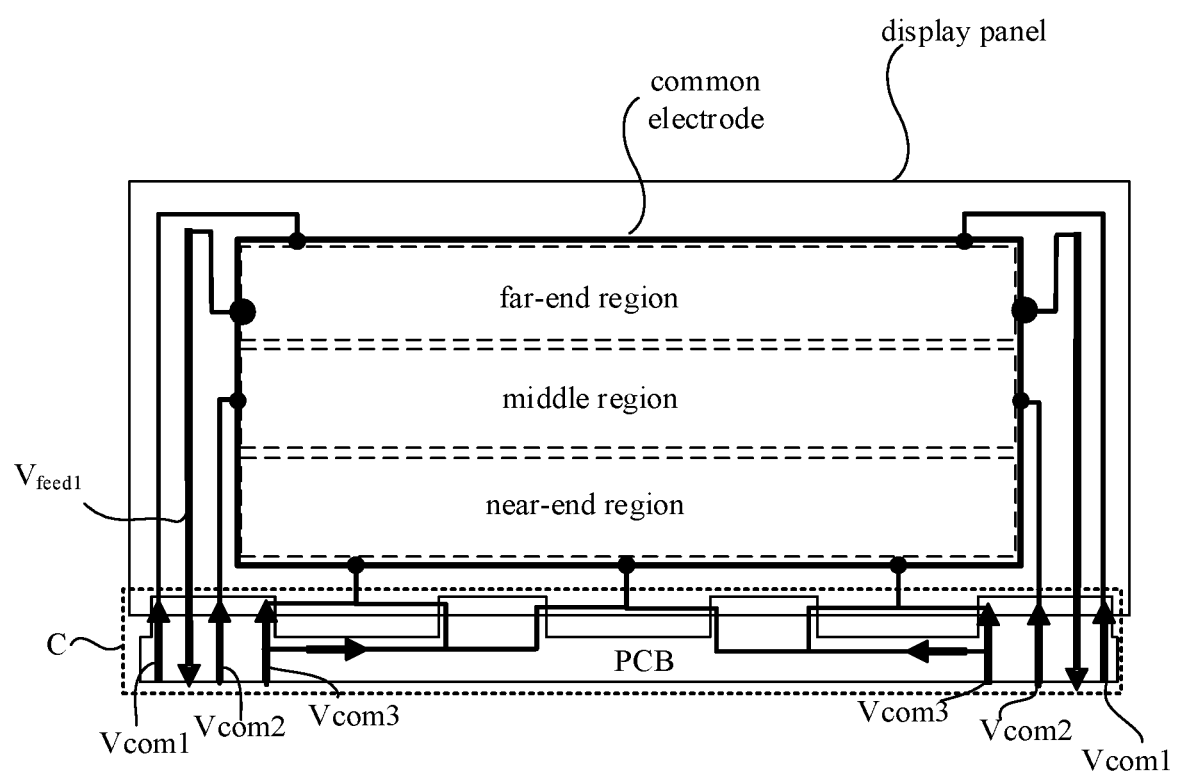
FIG. 3 is a schematic view of a display device in some embodiments of the present disclosure.

Illustratively, for a display device, as shown in FIG. 3, the display device includes a display panel, a common electrode located in the display panel, and a common voltage input region C that provides a common voltage to the common electrode.

The common electrode includes a near-end region, a middle region, and a far-end region which are further away from the common voltage input region C in order, and a near-end common voltage input end $V_{com3}$, a middle common voltage input end $V_{com2}$ and a far-end common voltage input end $V_{com1}$ corresponding and coupled to the common electrode lines in the near-end region, middle region and far-end region of the common electrode respectively are arranged in the common voltage input region C.

In practice, in general, the voltages of the near-end common voltage supply end, the middle common voltage supply end and the far-end common voltage supply end in the line are respectively output to the near-end common voltage input end $V_{com3}$, the middle common voltage input end $V_{com2}$ and the far-end common voltage input end $V_{com1}$ through a printed circuit board (PCB, Printed Circuit Board).

Based on the above, in related art, for the input voltage of the near-end common voltage input end $V_{com3}$, the voltage of the near-end common voltage supply end $V_{COM}$ is directly output to the near-end common voltage input end $V_{com3}$.

Figure 4:
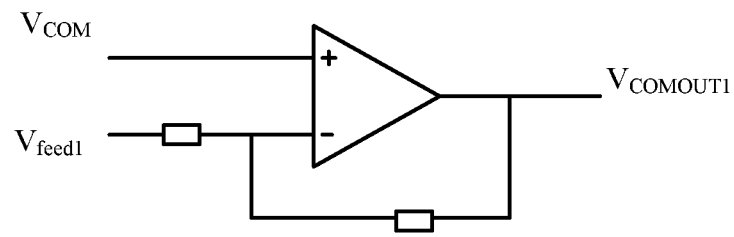
FIG. 4 is a schematic view of a common voltage supply end in some embodiments of the present disclosure.

For the input voltage of the far-end common voltage input end $V_{com1}$, refer to FIG. 4, generally, the voltage of the near-end common voltage supply end $V_{COM}$ is compared with the voltage of the far-end feedback end $V_{feed1}$, and then voltage of the near-end common voltage supply end $V_{COM}$ is compensated and amplified by a certain multiple to be the voltage of the far-end common voltage supply end $V_{COMOUT1}$ and then output to the far-end common voltage input end $V_{com1}$.

For the input voltage of the middle common voltage input end $V_{com2}$, the control process is basically the same as that of the input voltage of the far-end common voltage input end $V_{com1}$. Generally, the voltage of the near common voltage supply end $V_{COM}$ is compared with the voltage of the middle feedback end $V_{feed2}$ or the voltage of the far-end feedback end $V_{feed1}$ (preferably, the far-end feedback end is used to simplify the circuit), and then the voltage of the near common voltage supply end $V_{COM}$ is compensated and amplified by a certain multiple to be the voltage of the middle common voltage supply end $V_{COMOUT2}$ and then output to the middle common voltage input end $V_{com2}$.

The multiple of compensating and amplifying the input voltage of the middle common voltage input end $V_{com2}$ by the operational amplifier is smaller than the multiple of compensating and amplifying the input voltage of the far-end common voltage input end $V_{com1}$ by the operational amplifier.

Figure 5:
FIG. 5 is a voltage curve of a far-end region of a common voltage in some embodiments of the present disclosure.

However, since the gate driving signal output by the gate driving circuit in the display device may be coupled with the signal (common voltage) loaded on the common electrode, refer to FIG. 4 (e.g., the voltage transmission in the far-end region of the common electrode), the feedback voltage of the far-end feedback end $V_{feed1}$ may ripple. After the feedback voltage of the far-end feedback end $V_{feed1}$ is amplified by the operational amplifier (i.e., $V_{COMOUT1}$, the ripple amplitude of the voltage output to the far-end common voltage input end $V_{com1}$ may further increase (as shown in FIG. 5). As a result, a white line may appear in the far-end region of the display panel, which adversely affects the normal display.

Figure 6:
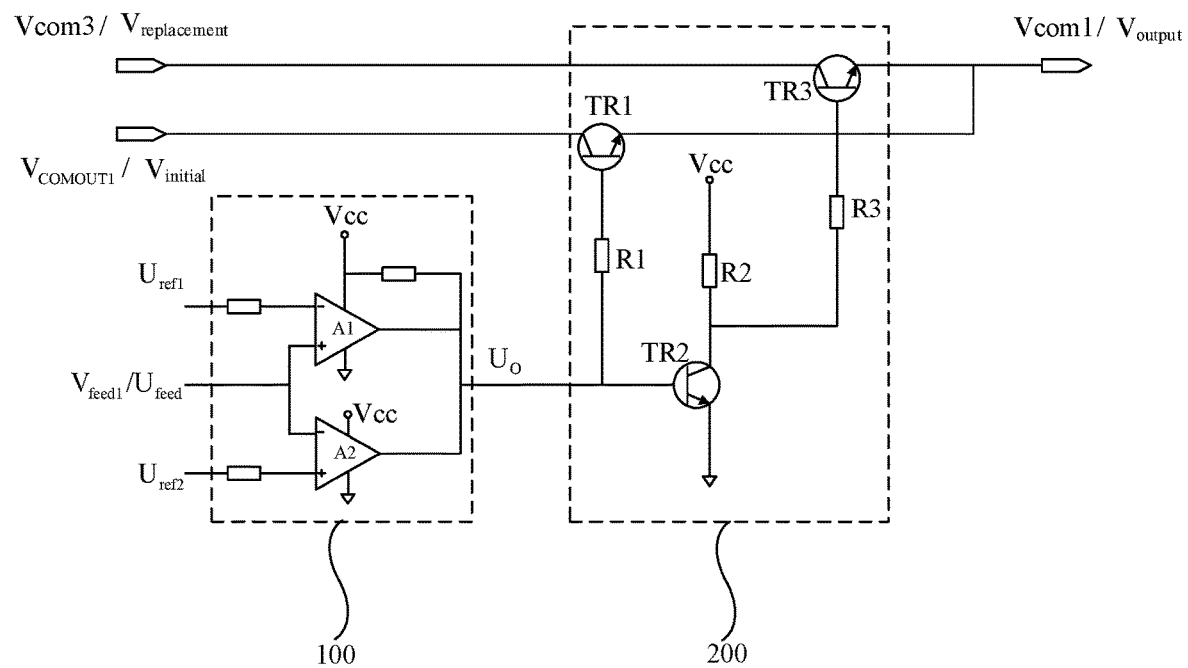
FIG. 6 is a schematic view of the common voltage control circuit in FIG. 1 serving as a far-end common voltage control circuit.

In view of this, in order to solve the above technical issues, the present disclosure provides the following solutions:

As shown in FIG. 6, the voltage control circuit 01 hereinabove may be used as the far-end common voltage control circuit 10. In this case, in the voltage control circuit 01 (i.e., the far-end common voltage control circuit 10), the feedback voltage end $U_{feed}$ is coupled to the far-end region of the common electrode (that is, coupled to the far-end feedback end $V_{feed1}$), and the initial voltage end $V_{initial}$ is coupled to the far-end common voltage supply end $V_{COMOUT1}$, and the output voltage end $V_{output}$ is coupled to the far-end common voltage input end $V_{com1}$.

Compared with the above related art where the voltage of the far-end common voltage supply end $V_{COMOUT1}$ is directly output to the far-end common voltage input end $V_{com1}$, which resulting in a white line in the far-end region of the display panel, according to the present disclosure, the voltage control circuit 01 hereinabove may be used as the far-end common voltage control circuit 10, without changing the original compensating and amplifying multiple, whether the voltage of the far-end feedback end $V_{feed1}$ is between the first reference voltage $V_{ref1}$ and the second reference voltage $V_{ref2}$ is determined (i.e., whether it is within the normal working voltage range), so as to output the original voltage of the far-end common voltage supply end $V_{COMOUT1}$ to the far-end common voltage input end $V_{com1}$, or output the voltage of the replacement voltage end $V_{replacement}$ to the far-end common voltage input end $V_{com1}$, so as to ensure that the voltage input from the far-end common voltage input end $V_{com1}$ may be maintained within the normal working voltage range, thereby avoiding the horizontal white line that occurs in the display of the display device.

Based on the above, in order to avoid adding the circuit, as shown in FIG. 6, the replacement voltage end $V_{replacement}$ may be directly coupled to the near-end common voltage supply end $V_{com3}$, so as to simplify the circuit structure.

For those skilled in the art, it can be understood that the voltage provided by the near-end common voltage supply end $V_{COM}$ is generally within a normal working voltage range required by the far-end region of the common electrode (that is, a range from the first reference voltage $V_{ref1}$ to the second reference voltage $V_{ref2}$). Of course, other normal operating voltage ranges in the display device that meet the requirements of the far-end region of the common electrode may also be used as the replacement voltage end $V_{replacement}$.

Figure 7:
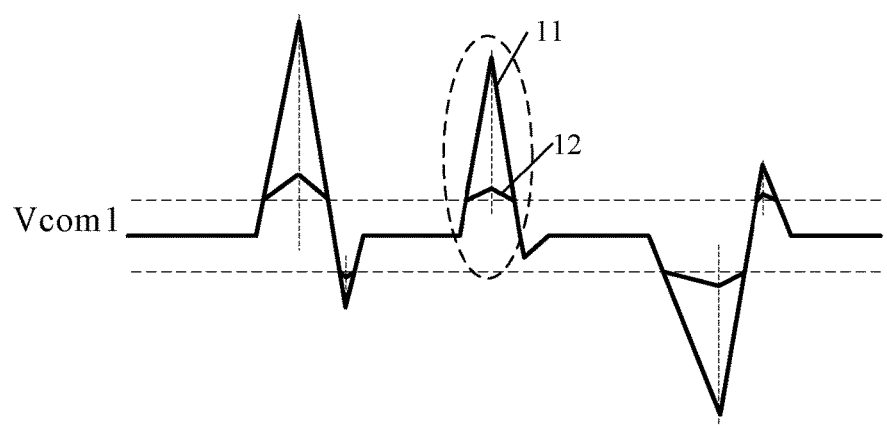
FIG. 7 shows a comparison of two types of far-end common voltages in case of providing a far-end common voltage control circuit and in case of providing no far-end common voltage control circuit.

In addition, the applicant compares the settings with the far-end common voltage control circuit 10 with setting without the far-end common voltage control circuit 10 in the related art, as shown in FIG. 7, taking a ripple in the input voltage of the voltage input end $V_{com1}$ for example (in the elliptical dotted circle line in FIG. 7), it can be seen that, the voltage ripple 11 in the related art is obviously higher than the voltage ripple 12 in the present disclosure. That is, by the far-end common voltage control circuit 10 in the present disclosure, the horizontal white line that occurs in the display of the display device may be effectively avoided without changing the multiple of compensating and amplifying.

Figure 8:
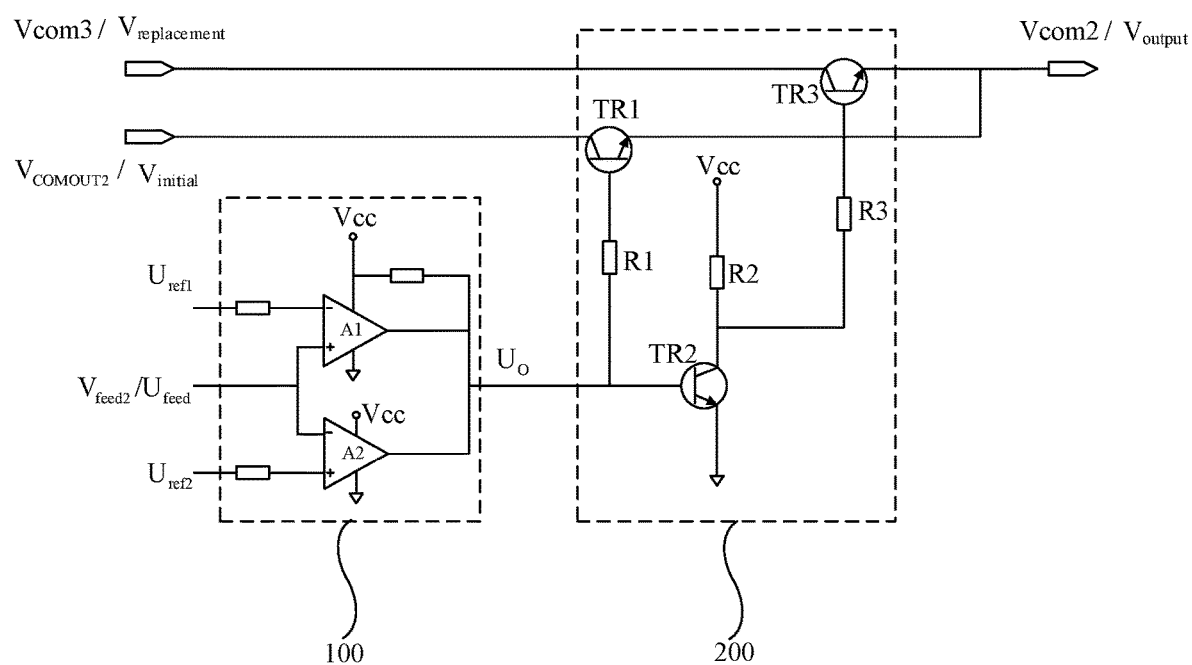
FIG. 8 is a schematic view of the common voltage control circuit in FIG. 1 serving as a middle common voltage control circuit.

Similarly, in some embodiments of the present disclosure, as shown in FIG. 8, the above voltage control circuit 01 may be used as the middle common voltage control circuit 20 (i.e., the middle common voltage control circuit 20 and the far-end common voltage control circuit 10 has the same circuit structure). In this case, in the voltage control circuit 01, referring to FIG. 8, the feedback voltage end $U_{feed}$ may be coupled to the middle region of the common electrode (that is, coupled to the middle feedback voltage end $V_{feed2}$)) or the far-end region of the common electrode (that is, coupled to the far-end feedback end $V_{feed1}$), the initial voltage end $V_{initial}$ is coupled to the middle common voltage supply end $V_{COMOUT2}$, and the output voltage end $V_{output}$ is coupled to the middle common voltage input end $V_{com2}$.

Of course, in order to avoid adding the circuit, as shown in FIG. 8, the replacement voltage end $V_{replacement}$ may also be coupled to the near-end common voltage supply end $V_{com3}$.

In addition, it should be noted that the first reference voltage $V_{ref1}$ in the far-end common voltage control circuit 10 and the first reference voltage $V_{ref1}$ in the middle common voltage control circuit 20 may be the same or different. The second reference voltage $V_{ref2}$ in the common voltage control circuit 10 may be the same as or different from the second reference voltage $V_{ref2}$ in the above middle common voltage control circuit 20, which is not limited herein.

Based on the above, in order to improve the integration degree, the far-end common voltage control circuit 10 and middle common voltage control circuit 20 may be integrated into a timing sequence control circuit Tcon IC.

In addition, in some embodiments, the first reference voltage $V_{ref1}$ and the second reference voltage $V_{ref2}$ used in the far-end common voltage control circuit 10 and middle common voltage control circuit 20 may be programmed into the memory module of the Tcon IC through the I2C interface, so as to generate a first reference voltage $V_{ref1}$ and a second reference voltage $V_{ref2}$. Alternatively, a gamma function block may also be used to directly generate the first reference voltage $V_{ref1}$ and the second reference voltage $V_{ref2}$ through a resistor divider circuit.

As such, the first reference voltage $V_{ref1}$ and the second reference voltage $V_{ref2}$ may be adjusted and set according to the actual situation, thereby improving the versatility of the display device.

Those of ordinary skill in the art may understand that all or part of the steps of implementing the foregoing method embodiments may be completed by a program instructing related hardware. The foregoing program may be stored in a computer-readable storage medium. When the program is executed, the program is executed. The method includes the steps of the foregoing method embodiment. The foregoing storage medium includes: a ROM, a RAM, a magnetic disk, or an optical disk, and other media that can store program codes.

The above are merely some embodiments of the present disclosure. A person skilled in the art may make further modifications and improvements without departing from the principle of the present disclosure, and these modifications and improvements shall also fall within the scope of the present disclosure.

What is claimed is:

1. A voltage control circuit, comprising a comparison sub-circuit and a switching sub-circuit;
    the comparison sub-circuit is coupled to a first reference voltage end, a second reference voltage end, a feedback voltage end and a comparison output end, the comparison output end is coupled to the switching sub-circuit, wherein the second reference voltage end is configured to input a second reference voltage, and first reference voltage end is configured to input a first reference voltage smaller than the second reference voltage;
    the switching sub-circuit is further coupled to an output voltage end, an initial voltage end and a replacement voltage end, wherein the replacement voltage end is configured to input a voltage between the first reference voltage and the second reference voltage;
    the comparison sub-circuit is configured to:
    determine whether a voltage of the feedback voltage end is between the first reference voltage of the first reference voltage end and the second reference voltage of the second reference voltage end;
    in the case that the voltage of the feedback voltage end is between the first reference voltage of the first reference voltage end and the second reference voltage of the second reference voltage end, control the comparison output end to output a first control signal; and
    in the case that the voltage of the feedback voltage end is not between the first reference voltage of the first reference voltage end and the second reference voltage of the second reference voltage end, control the comparison output end to output a second control signal;
    the switching sub-circuit is configured to:
    in the case that the voltage of the feedback voltage end is between the first reference voltage of the first reference voltage end and the second reference voltage of the second reference voltage end, transmit a voltage of the initial voltage end to the output voltage end, in response to the first control signal of the comparison output end; or
    in the case that the voltage of the feedback voltage end is not between the first reference voltage of the first reference voltage end and the second reference voltage of the second reference voltage end, transmit a voltage of the replacement voltage end to the output voltage end, in response to the second control signal of the comparison output end.

2. The voltage control circuit according to claim 1, wherein the replacement voltage end is configured to input an intermediate voltage of the first reference voltage and the second reference voltage.

3. The voltage control circuit according to claim 1, wherein the comparison sub-circuit is a dual-limit comparator;
    the first reference voltage end is configured to input a lower threshold voltage of the dual-limit comparator, and the second reference voltage end is configured to input an upper threshold voltage of the dual-limit comparator, wherein the first voltage is equal to the lower threshold voltage of the dual-limit comparator, the second voltage is equal to the upper threshold voltage of the dual-limit comparator;
    the feedback voltage end is configured to input an input voltage of the dual-limit comparator; and
    the comparison output end is an output end of the dual-limit comparator.

4. The voltage control circuit according to claim 1, wherein the switching sub-circuit comprises a first transistor, a second transistor, a third transistor, a first resistor, a second resistor and a third resistor;
    a gate of the first transistor is coupled to the comparison output end via the first resistor, a first electrode of the first transistor is coupled to the initial voltage end, and a second electrode of the first transistor is coupled to the output voltage end;
    a gate of the second transistor is coupled to the comparison output end, a first electrode of the second transistor is coupled to a first voltage end via the second resistor, and a second electrode of the second transistor is coupled to a second voltage end;
    a gate of the third transistor is coupled to the first electrode of the second transistor via a third resistor, a first electrode of the third transistor is coupled to the replacement voltage end, and a second electrode of the third transistor is coupled to the output voltage end.

5. The voltage control circuit according to claim 4, wherein the first transistor, the second transistor and the third transistor are all N-type transistors.

6. The voltage control circuit according to claim 3, wherein the dual-limit comparator comprises a first operational amplifier and a second operational amplifier;
    an inverting input end of the first operational amplifier is coupled to the first reference voltage end, and a non-inverting of the first operational amplifier and an inverting input end of the second operational amplifier are coupled to the feedback voltage end;
    a non-inverting of the second operational amplifier is coupled to the second reference voltage end;
    an output end of the first operational amplifier is coupled to an output end of the second operational amplifier, and the output end of the first operational amplifier and the output end of the second operational amplifier serve as the output end of the dual-limit comparator.

7. A display device, comprising a display panel and a far-end common voltage control circuit;
    the far-end common voltage control circuit is the voltage control circuit according to claim 1;
    the display panel comprises a common electrode and a common voltage input region, the common electrode comprises a near-end region and a far-end region further from the common voltage input region than the near-end region;
    the common voltage input region comprises: a near-end common voltage input end coupled to the near-end region of the common electrode and a far-end common voltage input end coupled to the far-end region of the common electrode;

in the far-end common voltage control circuit, the feedback voltage end is coupled to the far-end region of the common electrode, the output voltage end is coupled to the far-end common voltage input end, and the initial voltage end is coupled to a far-end common voltage supply end.

8. The display device according to claim 7, wherein in the far-end common voltage control circuit, the replacement voltage end is coupled to a near-end common voltage supply end.

9. The display device according to claim 7, wherein the common electrode further comprises: a middle region between the near-end region and the far-end region; and the common voltage input region further comprises: a middle common voltage input end coupled to the middle region of the common electrode;

the display device further comprises: a middle common voltage control circuit;

the middle common voltage control circuit and the far-end common voltage control circuit have the same circuit structure;

in the middle common voltage control circuit, the feedback voltage end is coupled to the middle region or the far-end region of the common electrode, the output voltage end is coupled to the middle common voltage input end, and the initial voltage end is coupled to a middle common voltage supply end.

10. The display device according to claim 9, wherein in the middle common voltage control circuit, the replacement voltage end is coupled to a near-end common voltage supply end.

11. The display device according claim 7, wherein the voltage control circuit is integrated in a timing sequence control circuit.

12. A method of controlling the voltage control circuit according to claim 1, comprising:

inputting a first reference voltage to the first reference voltage end, inputting a second reference voltage to the second reference voltage end, and inputting a feedback voltage to the feedback voltage end;

in the case that the feedback voltage is between the first reference voltage and the second reference voltage, transmitting, by the switching sub-circuit, a voltage of the initial voltage end to the output voltage end;

in the case that the feedback voltage is not between the first reference voltage and the second reference voltage, transmitting, by the switching sub-circuit, a voltage of the replacement voltage end to the output voltage end.

13. The method according to claim 12, wherein a voltage of the replacement voltage end is an intermediate voltage of the first reference voltage and the second reference voltage.

14. The method according to claim 12, wherein the comparison sub-circuit is a dual-limit comparator;

the first reference voltage of the first reference voltage end is a lower threshold voltage of the dual-limit comparator, and the second reference voltage of the second reference voltage end is an upper threshold voltage of the dual-limit comparator;

a voltage of the feedback voltage end is an input voltage of the dual-limit comparator; and the comparison output end is an output end of the dual-limit comparator.

* * * * *